United States Patent [19]
Okabe

[11] Patent Number: 5,521,106
[45] Date of Patent: May 28, 1996

[54] PROCESS FOR FABRICATING COMPLEMENTARY FIELD EFFECT TRANSISTORS HAVING A DIRECT CONTACT ELECTRODE

[75] Inventor: Kazuhiro Okabe, Tokyo, Japan

[73] Assignee: NEC Corporation, Tokyo, Japan

[21] Appl. No.: 271,963

[22] Filed: Jul. 8, 1994

[30] Foreign Application Priority Data

Jul. 8, 1993 [JP] Japan ................................. 5-193071

[51] Int. Cl.⁶ ............................................. H01L 21/336
[52] U.S. Cl. .................. 437/41; 437/44; 437/34; 437/57
[58] Field of Search ........................ 437/40, 41, 34, 437/56, 57, 40 SW, 41 SW, 41 SM, 44

[56] References Cited

U.S. PATENT DOCUMENTS

| 4,374,700 | 2/1983 | Scott et al. | 437/34 |
| 4,547,959 | 10/1985 | Rusch et al. | 437/34 |
| 4,792,835 | 12/1988 | Sacarisen et al. | 437/34 |

OTHER PUBLICATIONS

I. Sakai et al., "A New Salicide Process (PASET) for Sub–half Micron CMOS", 1992 Symposium on VLSI Technology Digest of Technical Papers, pp. 66–67.

T. Tang et al., "VLSI Local Interconnect Level Using Titanium Nitride", IEDM 1985, pp. 590–593.

Primary Examiner—Mary Wilczewski
Attorney, Agent, or Firm—Sughrue, Mion, Zinn, Macpeak & Seas

[57] ABSTRACT

A process for fabricating a semiconductor device comprising the steps of forming a gate insulation layer on a first conductive type semiconductor substrate, forming a polycrystalline silicon layer on the gate insulation layer, and selectively removing the polycrystalline silicon layer to form a gate electrode and a direct contact electrode. The process also includes a step of forming a photoresist mask masking the direct contact electrode at least at the side opposing the gate electrode, and performing ion implantation of a second conductive type impurity for forming an impurity diffused layer at both sides of the gate electrode. The direct contact electrode and the impurity diffused layer are electrically connected by a conductive layer covering the surface of one of the impurity diffused layer and the side surface of the direct contact electrode.

4 Claims, 12 Drawing Sheets

FIG. 5 ically, the
invention relates to a process for fabricating a direct contact
electrode of a MOSFET integrated circuit.

2. Description of the Related Art concerning semiconductor devices of the type which the
present invention concerns, discussion will be given in terms
of a PN dual-gate CMOS semiconductor device. In a PN
dual-gate CMOS semiconductor device, a P-type transistor
has a P-type gate electrode, and an N-type transistor has a
N-type gate electrode. The feature of such semiconductor
device is the capability of suppression of short-channel
effect of the P-type transistor since the channel of the P-type
transistor becomes a surface-channel type. FIGS. 1A to 1L
are cross sections showing the conventional fabrication
process of the PN dual-gate CMOS transistor.

Figure 1A:
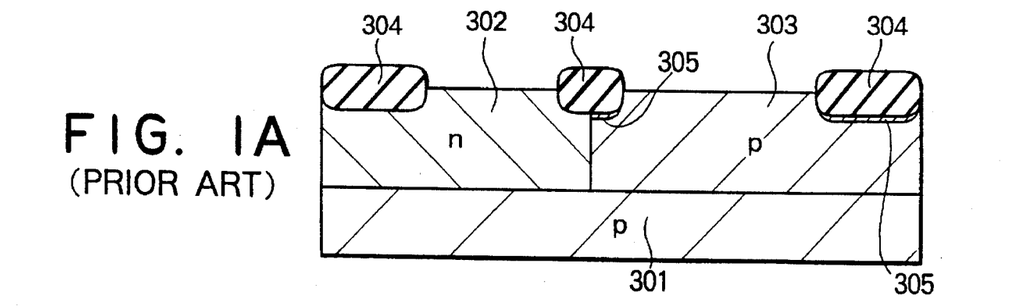
FIGS. 1A to 1L are fragmentary sections showing a series of steps in the conventional semiconductor device fabrication process.
Figure 1B:
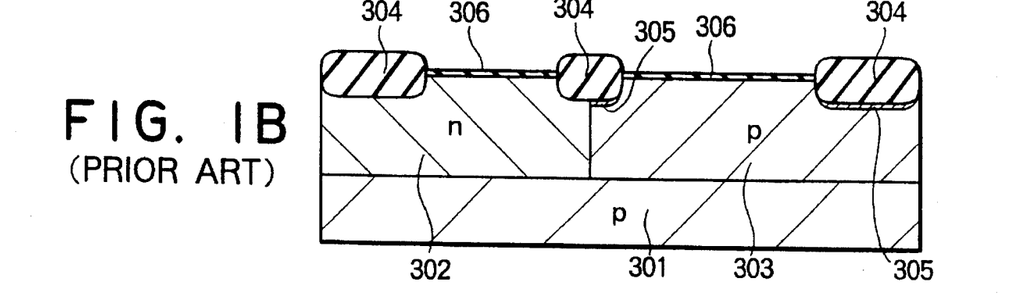
Figure 1C:
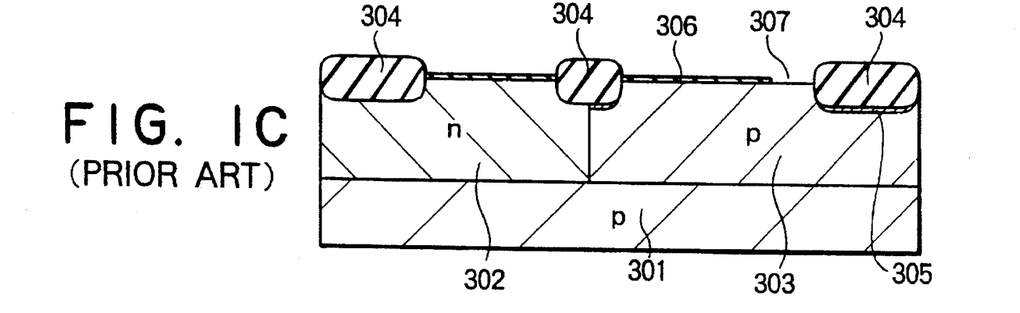

Initially, utilizing known technologies, an N well 302, a P
well 303, a field oxide layer 304, and P-type channel stopper
305 are formed on a P-type silicon substrate 301, as shown
in FIG. 1A. Then, by a thermal oxidation process, a gate
oxide layer 306 in the thickness of 100 Å is formed on the
N well 302 and the P well 303, as shown in FIG. 1B.
Thereafter, the gate oxide layer 306 at a direct contact region
307 is removed by way of photoetching, as shown in FIG.
1C.

Figure 1D:
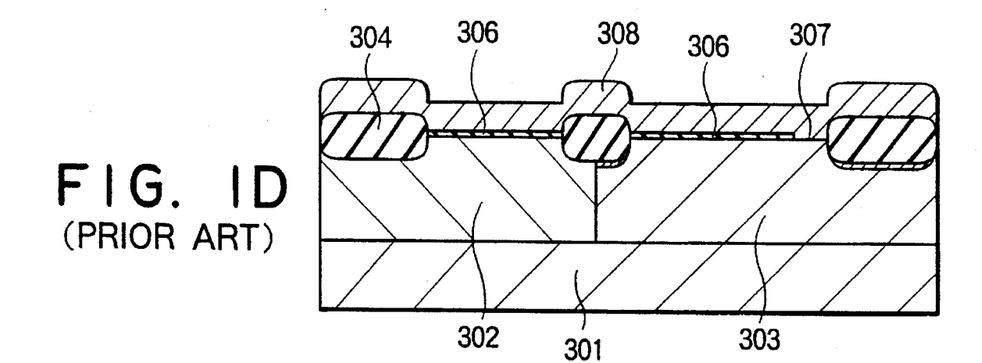
Figure 1E:
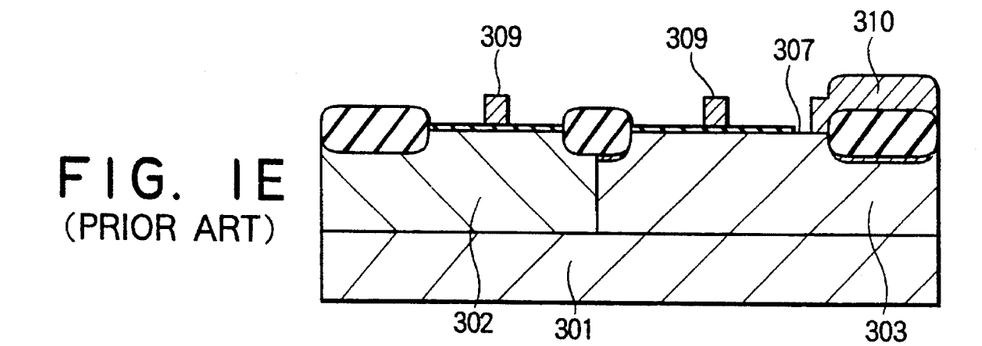
Figure 2:
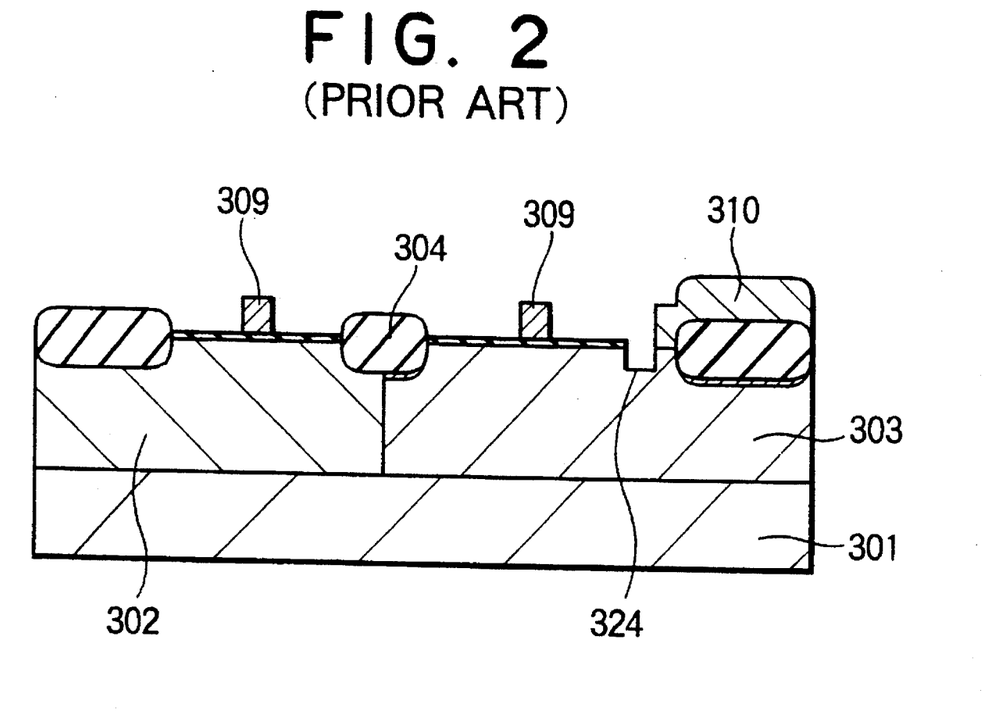
FIG. 2 is a fragmentary section of the semiconductor device showing defect in the prior art.

Next, as shown in FIG. 1D, by way of chemical vapor
deposition (CVD), a non-doped polycrystalline layer 308 is
deposited in a thickness of the order of 3000 Å. Subsequently, by photolithography and dry etching, gate electrodes 309 and a direct contact electrode 310 are formed, as
shown in FIG. 1E. In this process, the ideal section is as
illustrated in FIG. 1E. However, in practice, in order to avoid
a residual layer after etching through the overall surface of
the wafer, over-etching is inherently performed to form a pit
324 in the substrate, as shown in FIG. 2.

In order to simplify the disclosure, the following discussion will be given on the assumption that the ideal section as
shown in FIG. 1E can be formed.

Figure 1F:
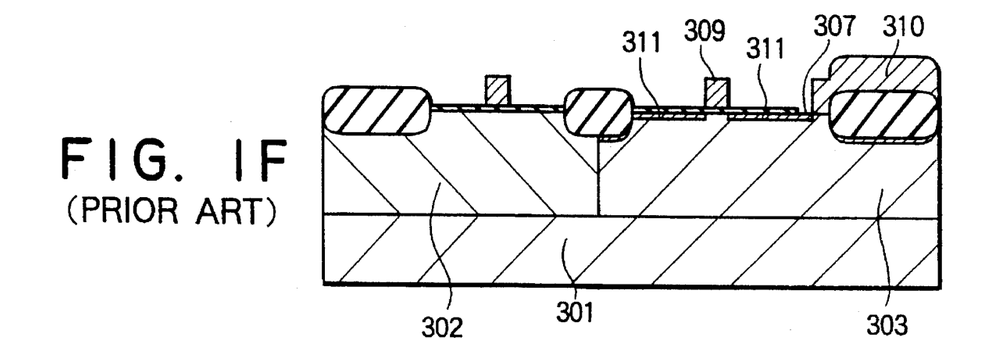

Next, as shown in FIG. 1F, photolithography and ion
implantation are applied to form a N -type diffusion layer
311 in the region to form the N-type transistor on the surface
of the substrate.

Figure 1G:
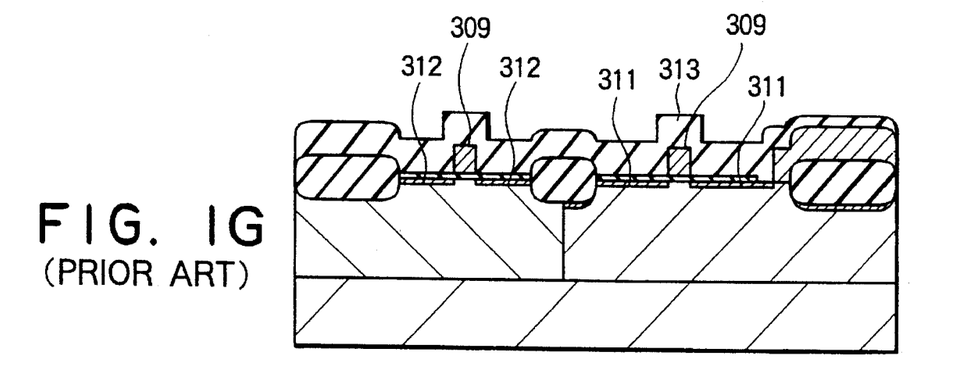
Figure 1H:
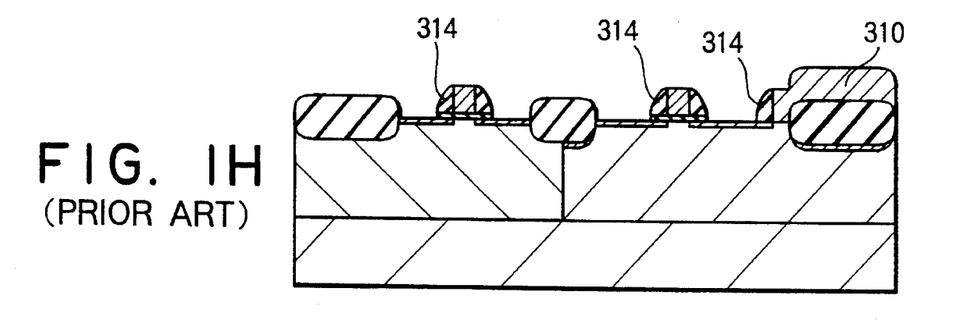

Then, as shown in FIG. 1G, photolithography and ion
implantation are applied to form a P -type diffusion layer 312
in the region to form the P-type transistor on the surface of
the substrate. Subsequently, by way of CVD, an insulation
layer 313 is grown to a thickness of 2000 Å. Thereafter, as
shown in FIG. 1H, side walls 314 are formed by performing
anisotrophy etching.

Figure 1I:
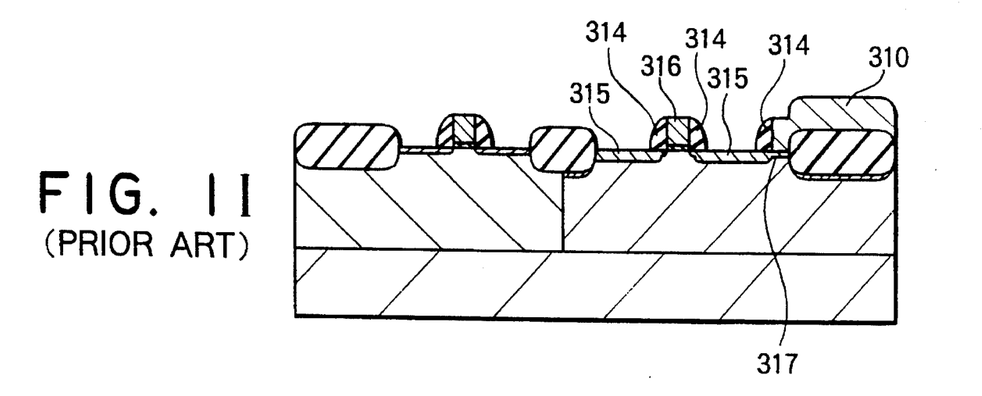

Then, the region to form the P-type transistor is masked
by way of photolithographic technology. Thereafter, arsenic
(As) is implanted in the order of $5 \times 10^{15}$ cm$^{-2}$ at 70 keV, and
then the substrate is annealed at 900° C. for 10 minutes to
form N$^+$-type diffusion layer 315, N$^+$type gate electrode 316
and N$^+$-type diffusion layer 317 for a direct contact region
of the N-type transistor, as shown in FIG. 1I.

Figure 1J:
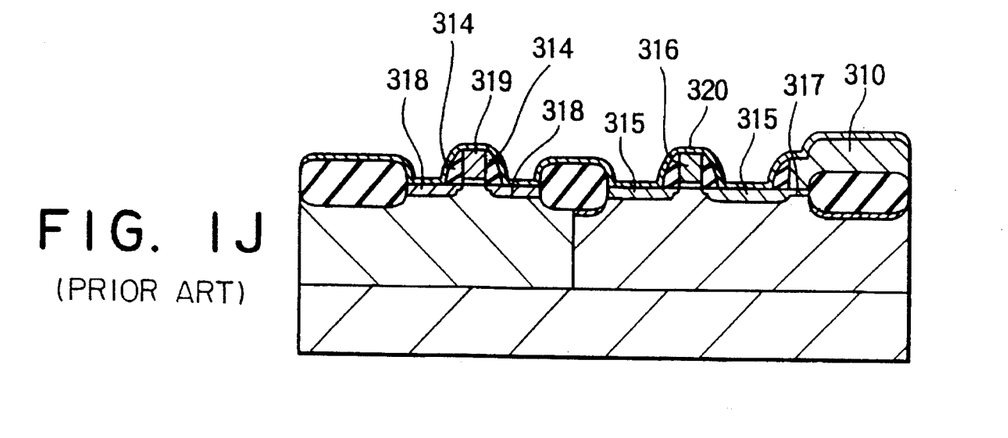

Next, the region, in which the N-type transistor is formed,
is masked by way of photolithographic technology. Thereafter, as shown in FIG. 1J, boron (B) is implanted in the
order of $5 \times 10^{15}$ cm$^{-2}$ at 10 keV, and then the substrate is
annealed at 850° C. for 10 minutes to form P$^+$-type diffusion
layer 318 and P$^+$type gate electrode 319 of the P-type
transistor. Thereafter, by ion implantation of silicon in the
order of $1 \times 10^{15}$ cm$^{-2}$ at 70 keV the substrate surface is
transformed to an amorphous state. Subsequently, a titanium
layer 320 is formed over the entire surface of the substrate
to the thickness of 500 Å, as shown in FIG. 1J.

Figure 1K:
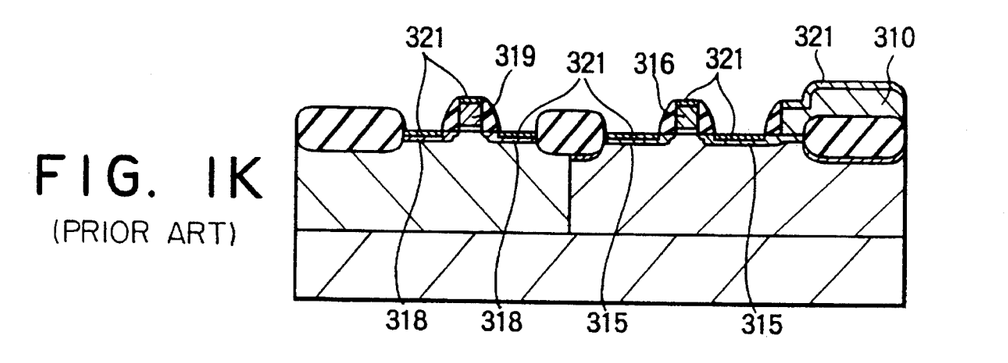

Next, as shown in FIG. 1K, heat treatment (rapid thermal
anneal) under a nitrogen atmosphere is performed at a
temperature of 700° C. to selectively form a titanium silicide
film 321 on the N$^+$-type diffusion layer 315, the N$^+$-type gate
electrode 316, the direct contact electrode 310 of the N-type
transistor, the P$^+$-type diffusion layer 318, and the P$^+$-type
gate electrode 319 of the P-type transistor. Subsequently, the
substrate is dipped in a mixture of aqueous ammonia and
hydrogen peroxide to selectively remove titanium nitride
which is nitrided and not silicided (FIG. 1K).

Figure 1L:
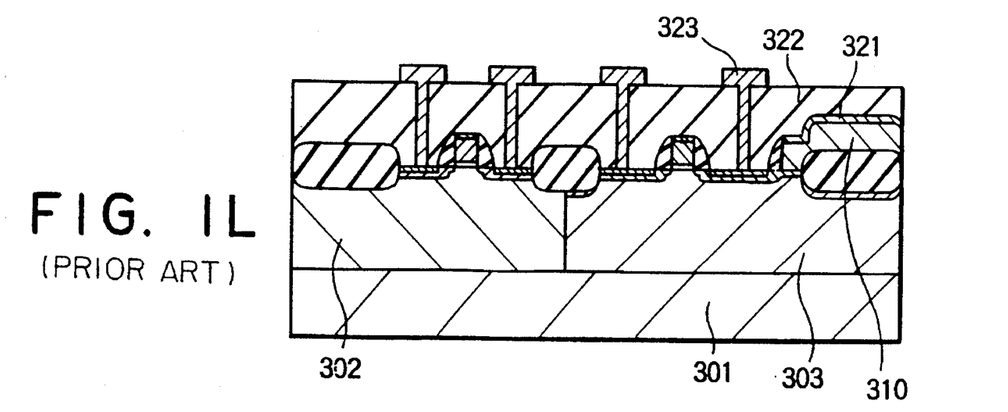

Then, as shown in FIG. 1L, an interlayer insulation layer
322 and wiring 323 are deposited by known technology to
obtain the PN dual-gate CMOS with the direct contact of a
conventional structure.

The prior art described above have been disclosed in
Thomas Tang et al. "VLSI LOCAL INTERCONNECT
LEVEL USING TITANIUM NITRIDE" IEDM 1985, pp
590–593, I. Sakai et al. "A NEW SALICIDE PROCESS
(PASET) FOR SUB-HALF MICRON CMOS", 1992 symposium on VLSI technology Digest Technical Papers, pp.
66–67.

The conventional process for forming the direct contact as
set forth above is required to perform overetching in the
etching step for the non-doped polycrystalline silicon layer
308 shown in FIG. 1E so as not to leave residual over the
entire surface of the wafer. However, since there is no
selectivity between the non-doped polycrystalline silicon
and silicon of the substrate in etching, the overetching
inherently results in etching of the substrate to introduce
defects in the substrate. Therefore, a junction layer leak
current is increased to cause degradation of the device
characteristics and lowering of yield.

Also, since the prior art requires a special photolithographic step for forming the direct contact hole, the number
of process steps is increased and the process becomes
complicated.

SUMMARY OF THE INVENTION

Therefore, it is an object of the present invention to
provide a process for fabricating a semiconductor device
which can prevent a substrate from being etched so as not to
introduce defects in the substrate and which improves yield
in fabrication and enhances the characteristics of semiconductor devices.

Another object of the present invention is to simplify a
fabrication process by avoiding the necessity of formation of
a direct contact hole and thus lower the cost for fabrication.

In order to accomplish the above-mentioned and other
objects, a process for fabricating a semiconductor device,
according to the first aspect of the invention, comprises the
steps of: forming a gate insulation layer on a first conductive
type semiconductor substrate; forming a polycrystalline
silicon layer on the gate insulation layer; selectively removing the polycrystalline silicon layer to form a gate electrode
and a direct contact electrode; forming a photoresist mask
masking the direct contact electrode at least at the side opposing the gate electrode; performing ion implantation of a second conductive type impurity for forming an impurity diffused layer at both sides of the gate electrode; and forming a conductive layer covering the surface of one of the impurity diffused layer and the side surface of the direct contact electrode for shorting between one of the impurity diffused layer and the direct contact electrode.

According to the second aspect of the invention, a process for fabricating a semiconductor device comprises the steps of: forming a gate insulation layer on a first conductive type semiconductor substrate; forming a polycrystalline silicon layer on the gate insulation layer; selectively removing the polycrystalline silicon layer to form a gate electrode and a direct contact electrode; forming a photoresist mask masking the direct contact electrode at least at the side opposing the gate electrode; performing ion implantation of a second conductive type impurity for forming a low concentration impurity diffused layer at both sides of the gate electrode; selectively forming an insulation layer by liquid growth process on a region where the photoresist mask is not formed and forming a side wall insulation layer on the side surface of the gate electrode by anisotropic etching of the insulation layer; performing ion implantation of the second conductive type impurity to form a high concentration impurity diffused layer on a region of the surface of the semiconductor substrate outside of the side wall insulation layer; and forming a refractory metal silicide layer by deposition of a refractory metal layer and heat treatment thereof for shorting the high concentration impurity diffused layer and the direct contact electrode.

According to the third aspect of the invention, a process for fabricating a semiconductor device comprises the steps of: forming a gate insulation layer on a first conductive type semiconductor substrate; forming a polycrystalline silicon layer on the gate insulation layer; selectively removing the polycrystalline silicon layer to form a gate electrode and a direct contact electrode; forming a photoresist mask masking the direct contact electrode at least at the side opposing the gate electrode; performing ion implantation of a second conductive type impurity for forming a low concentration impurity diffused layer at both sides of the gate electrode; selectively forming an insulation layer by liquid growth process on a region where the photoresist mask is not formed and forming a side wall insulation layer on the side surface of the gate electrode by anisotropic etching of the insulation layer; performing ion implantation of the second conductive type impurity to form a high concentration impurity diffused layer on a region of the surface of the semiconductor substrate outside of the side wall insulation layer; and forming a refractory metal silicide layer by selective growth of a refractory metal and heat treatment thereof for shorting the high concentration impurity diffused layer and the direct contact electrode.

According to the fourth aspect of the invention, a process for fabricating a semiconductor device comprises the steps of: forming a gate insulation layer on a first conductive type semiconductor substrate; forming a gate electrode and a direct contact electrode on the gate insulation layer; forming an impurity diffused layer by ion implantation of second conductive type impurity; and forming a conductive layer for establishing electrical communication between the direct contact electrode and the impurity diffused layer.

The process may further comprise the steps of masking the direct contact electrode at least at the side opposing said gate electrode; and forming a side wall insulation layer on the side surface of the gate electrode, before the step of forming the impurity diffused layer. Preferably, the step of forming the gate electrode and the direct contact electrode comprises the steps of: forming a semiconductor layer on the gate insulation layer; and selectively removing the semiconductor layer while leaving portions to form the gate electrode and the direct contact electrode. The conductive layer may be formed of a refractory metal.

BRIEF DESCRIPTION OF THE DRAWINGS

The present invention will be understood more fully from the detailed description given herebelow and from the accompanying drawings of the preferred embodiments of the invention, which, however, should not be taken to be limitative to the invention but are for explanation and understanding only.

In the Drawings.

DETAILED DESCRIPTION OF THE PREFERRED EMBODIMENTS

The preferred embodiments of a semiconductor device fabrication process according to the present invention will be described in detail with reference to FIGS. 3A to 3N. In the following description, numerous specific details are set forth in order to provide a thorough understanding of the present invention. It will be obvious, however, to those skilled in the art that the present invention may be practiced without these specific details. In other instances, well-known structures are not shown in detail in order not to unnecessary obscure the present invention.

Figure 3A:
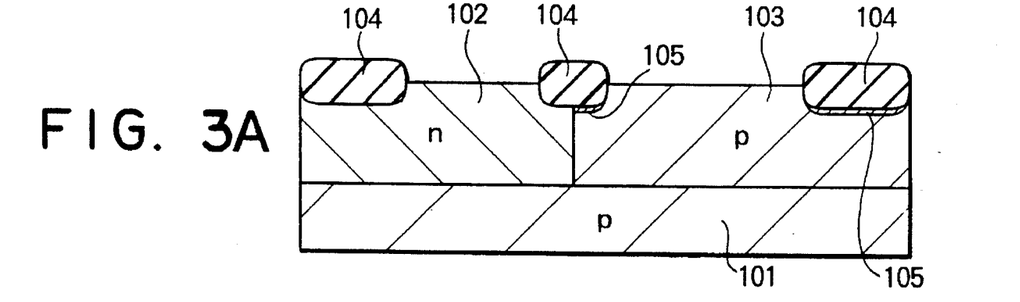
FIGS. 3A to 3N are fragmentary sections showing a series of steps in the first embodiment of a semiconductor device fabrication process according to the invention.
Figure 3B:
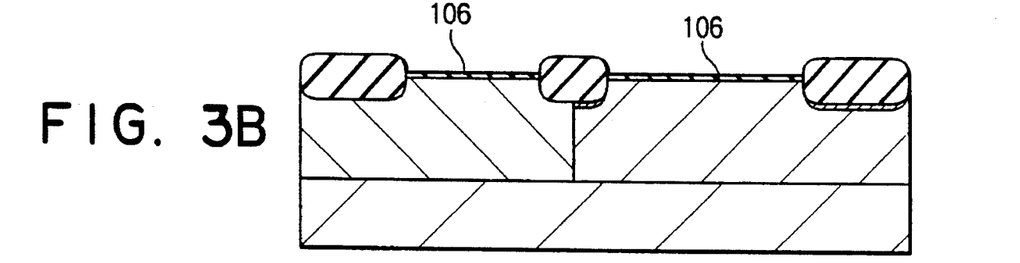
Figure 3C:
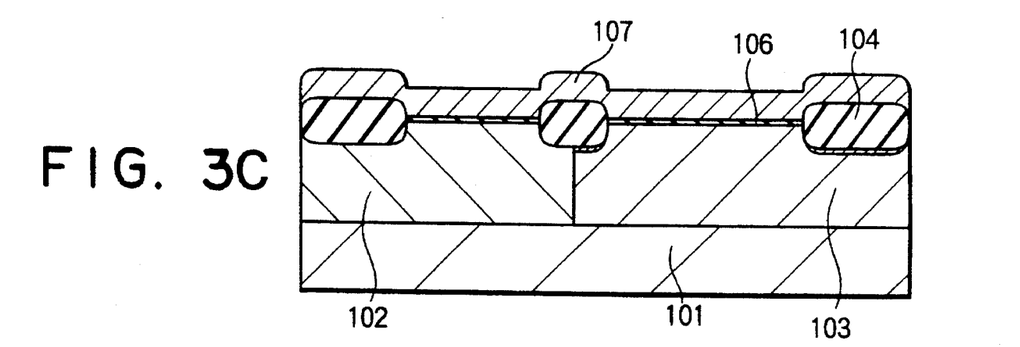
Figure 3D:
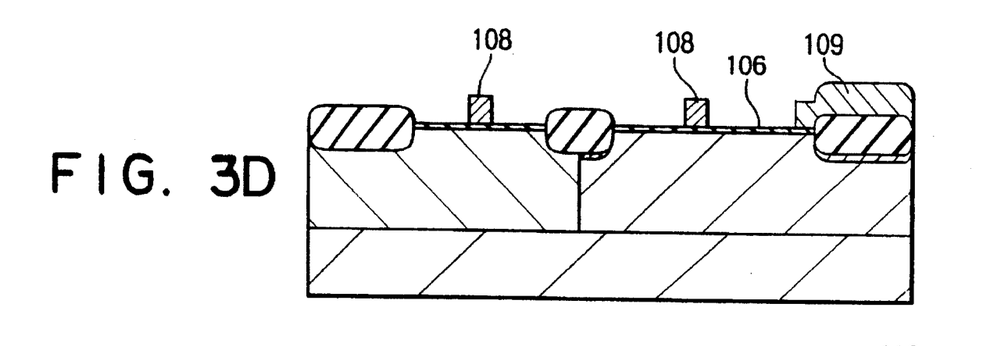
Figure 3E:
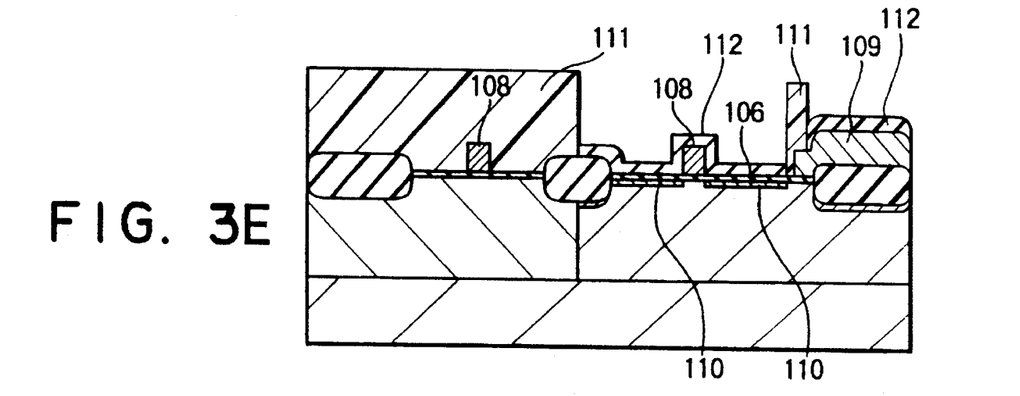
Figure 3F:
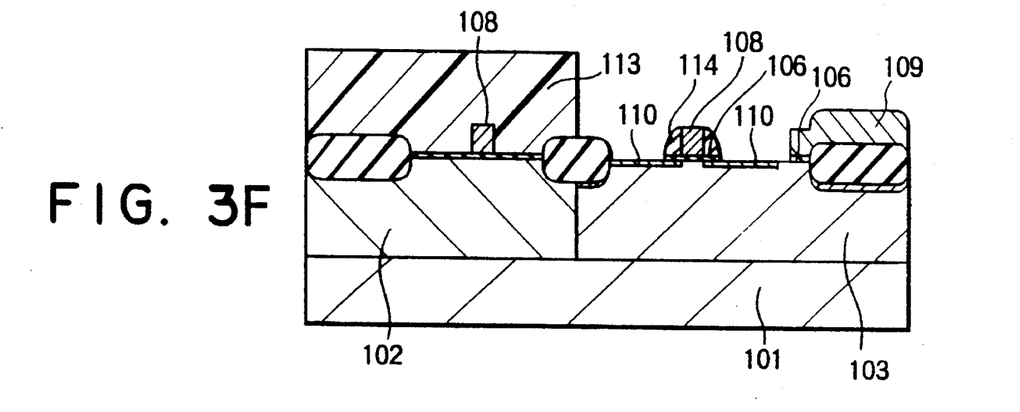
Figure 3G:
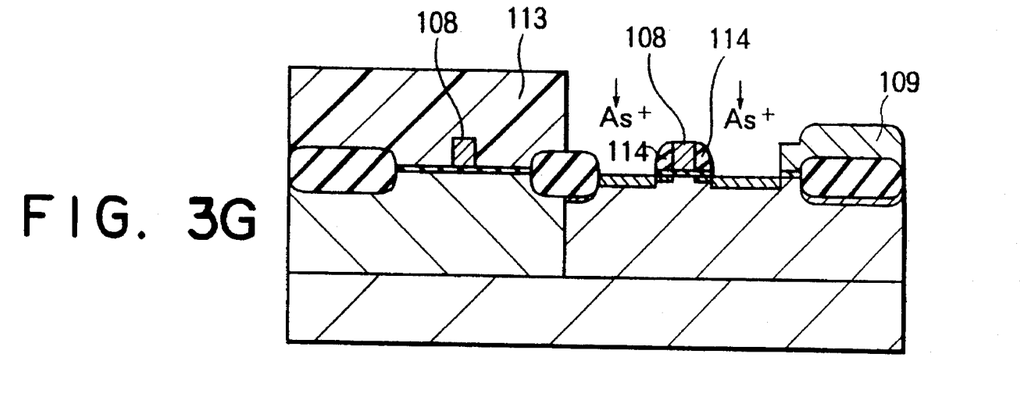
Figure 3H:
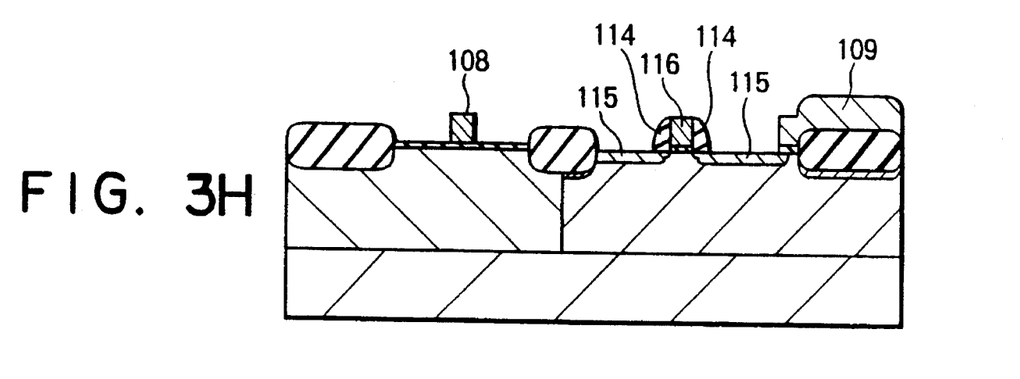
Figure 3I:
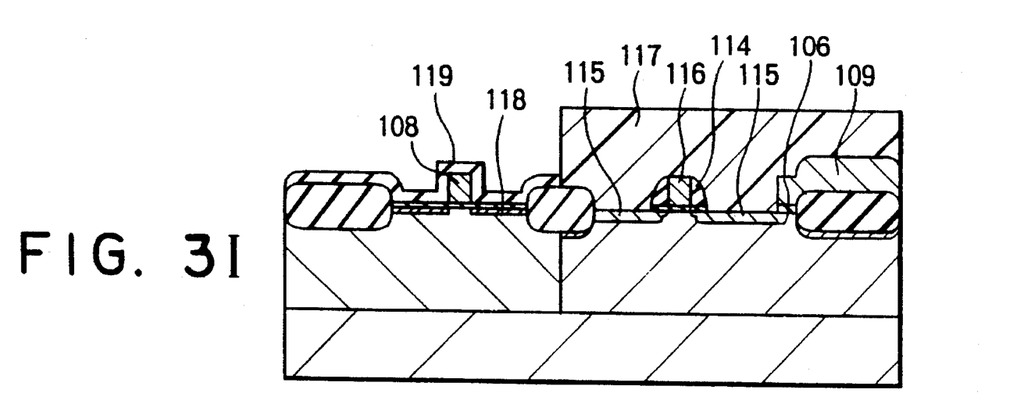
Figure 3J:
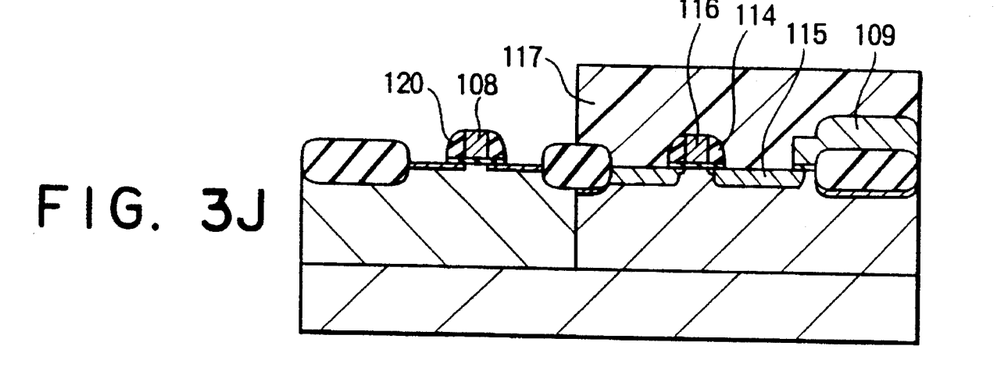
Figure 3K:
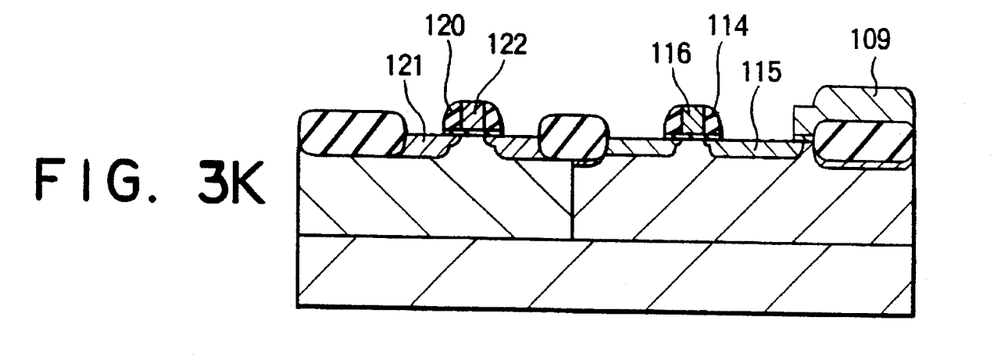
Figure 3L:
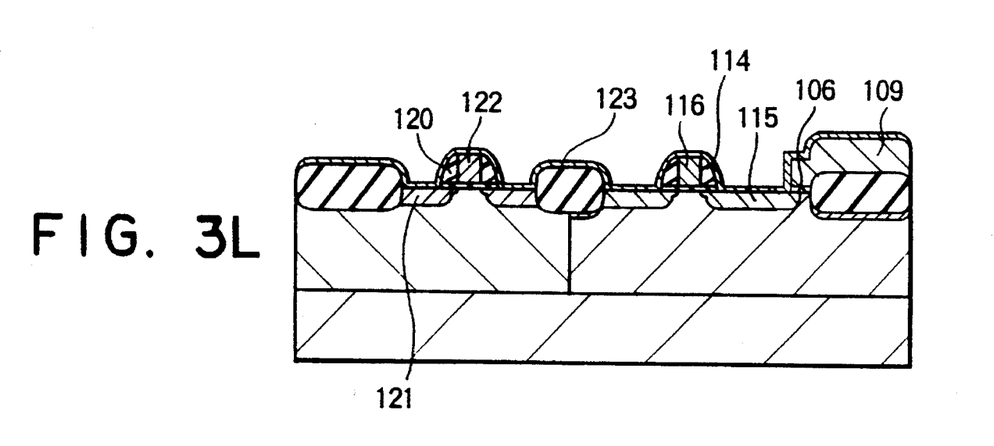
Figure 3M:
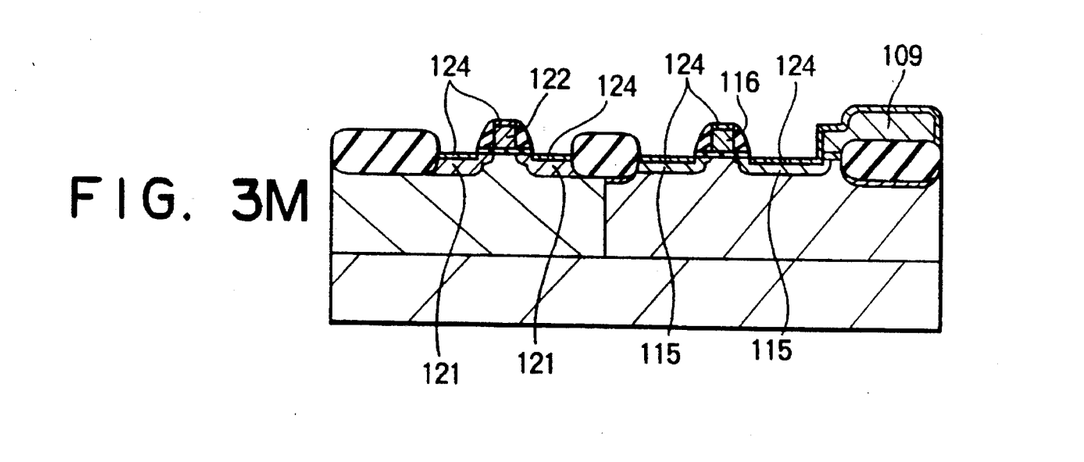
Figure 3N:
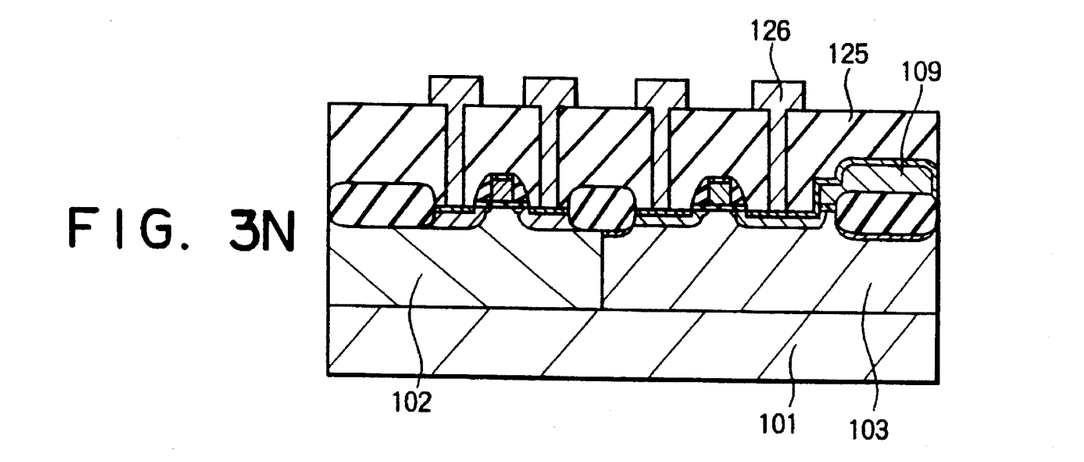

FIGS. 3A to 3N are fragmentary sections showing a series of steps in the first embodiment of a semiconductor device fabrication process according to the invention.

In the initial step, N well 102, P well 103, a field oxide layer 104 and $P^{30}$ -type channel stopper 105 are formed on a P-type silicon substrate 101 by way of the per se known technology, as illustrated in FIG. 3A. Then, a gate oxide layer 106 having an exemplary thickness of 100 Å is formed by way of thermal oxidation process, as shown in FIG. 3B. Thereafter, as shown in FIG. 3C, a non-doped polycrystalline silicon layer 107 in the thickness of approximately 3000 Å is deposited by CVD process.

Then, patterning by a photolithographic process and dry etching process is performed for the non-doped polycrystalline silicon layer 107 to form a gate electrode 108 and a direct contact electrode 109, as shown in FIG. 3D.

Subsequently, as shown in FIG. 3E, by way of photolithographic process, a photoresist film 111 covering a region over the N well and the side surface of the direct contact electrode 109 at the side of the gate electrode 108 is used to form a P-type transistor. Then, by ion implantation of phosphorous (P), $N^-$-type diffusion layers 110 are formed in a region to form the N-type transistor. Then, by way of a liquid growth process, an insulation layer 112 is grown in a thickness of 2000 Å on the region not covered by the photoresist film 111. The liquid growth process has been disclosed in Symp. VLSI Tech., 1990, p3, Japanese Unexamined Patent Publication (Kokai) Showa 64-25986 and so forth. Thereafter, as shown in FIG. 3F, the photoresist film 111 is removed and new photoresist film 113 is formed over the region to form the P-type transistor by new photolithographic process. Subsequently, anisotropic etching is performed to form a side wall 114 for the side wall of the gate electrode 108 of the N-type transistor.

Then, as shown in FIG. 3G, arsenic (As) is implanted in the order of $5 \times 10^{15}$ cm$^{-2}$ at 70 keV, and then heat treatment is performed at 900° C. for 10 minutes to form N$^+$-type diffusion layer 115 and N$^+$-type gate electrode 116 of the N-type transistor, as shown in FIG. 3H. Subsequently, the region to form the N-type transistor is covered by a photoresist film 117 by way of photolithographic process, as shown in FIG. 3I. Then, an insulation layer 119 in a thickness of 2000 Å is formed by liquid growth process on the region not covered by the photoresist film 117, as shown in FIG. 3I.

Next, anisotropic process is performed for forming a side wall 120 on the side wall of the gate electrode 108 of the P-type transistor, as shown in FIG. 3J. Thereafter, boron (B) is implanted in the order of $5 \times 10^{15}$ cm$^{-2}$ at 10 keV, and then heat treatment is performed at 850° C. for 10 minutes to form P$^+$-type diffusion layer 121 and P$^+$type gate electrode 122 of the P-type transistor, as shown in FIG. 3K. It should be noted that, in this boron implantation step, the photoresist mask 117 which is used for forming the insulation layer 119 can be used in common. Therefore, it becomes unnecessary to perform new photolithographic process. Thereafter, by ion implantation of silicon in the order of $1 \times 10^{15}$ cm$^{-2}$ at 70 keV the substrate surface is transformed to an amorphous state to form a titanium layer 123 over the entire surface of the substrate in an exemplary thickness of 500 Å, as shown in FIG. 3L.

Next, heat treatment under nitrogen atmosphere is performed at a temperature of 700° C. to selectively form a titanium silicide film 124 on the N$^+$-type diffusion layer 115, the N$^+$-type gate electrode 116, the direct contact electrode 109 of the N-type transistor, the P$^+$-type diffusion layer 121, and the P$^+$-type gate electrode 122 of the P-type transistor, as shown in FIG. 3M. Subsequently, the substrate is dipped in a mixture of aqueous ammonia and hydrogen peroxide to selectively remove titanium nitride which is nitrided and not silicided. At this time, the N$^+$-type diffusion layer 115 and the direct contact electrode 109 are electrically shorted by the titanium silicide layer 124. Then, an interlayer insulation layer 125 is deposited, a contact hole is opened and wiring 126 is formed by known technology to obtain the shown embodiment of the PN dual-gate CMOS according to the present invention.

In the PN dual-gate CMOS fabrication process set forth above, a pit is not formed in the substrate and thus a defect is not introduced in the substrate. Therefore, the leak current can be reduced to enhance the characteristics of the element.

Figure 5:
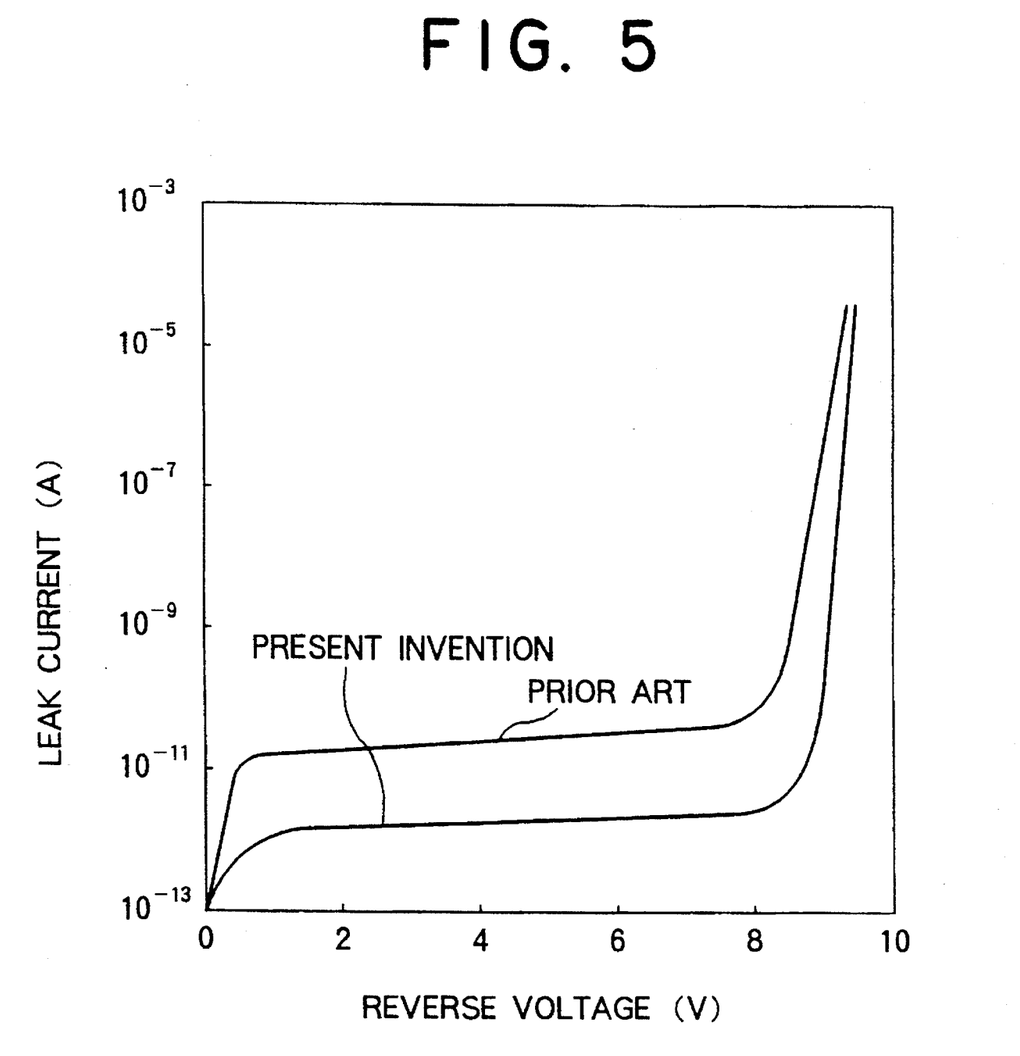
FIG. 5 is a graph showing leak current characteristics of the first embodiment of a semiconductor device according to the invention and the conventional semiconductor device.

FIG. 5 shows the leak current characteristics of the semiconductor device according to the present invention and the prior art. As can be clear from FIG. 5, the PN dual-gate CMOS having the direct contact fabricated through the shown embodiment, has approximately one tenth of the leak current in comparison with that fabricated through the conventional fabrication process.

In the foregoing first embodiment of the semiconductor device fabrication process, photolithographic process is performed for the following six steps:

1 formation of gate electrode and direct contact electrode;
2 formation of P-type transistor forming region;
3 masking of the P-type transistor forming region;
4 masking of the N-type transistor forming region;
5 formation of a direct contact hole through the interlayer insulation layer; and
6 formation of wiring.

In contrast to this, in the conventional semiconductor device fabrication process, it has been required to perform photolithographic process for the following eight steps:

1 formation of a direct contact region window;
2 formation of gate electrode and direct contact electrode;
3 masking of the P-type transistor forming region;
4 masking of the N-type transistor forming region;
5 masking of the P-type transistor forming region;
6 masking of the N-type transistor forming region;
7 formation of a direct contact hole through the interlayer insulation layer; and
8 formation of wiring.

Namely, the present invention can significantly reduce the process steps to realize the simplification of the fabrication process. This clearly contributes to the lowering of the fabrication cost of the semiconductor device.

Next, the second embodiment of the semiconductor device fabrication process according to the present invention will be discussed with reference to FIGS. 4A to 4C.

In the second embodiment of the fabrication process, the process steps up to the step illustrated in FIG. 3K are common to the foregoing first embodiment. Therefore, FIG. 4A illustrates the step corresponding to the step of FIG. 3K. It should be noted that the reference numerals given for respective components in the second embodiment have common values to the corresponding components in the first embodiment in the lower two digits, and redundant discussion for the common components will be neglected to maintain the disclosure simple enough to facilitate clear understanding of the invention.

Figure 4A:
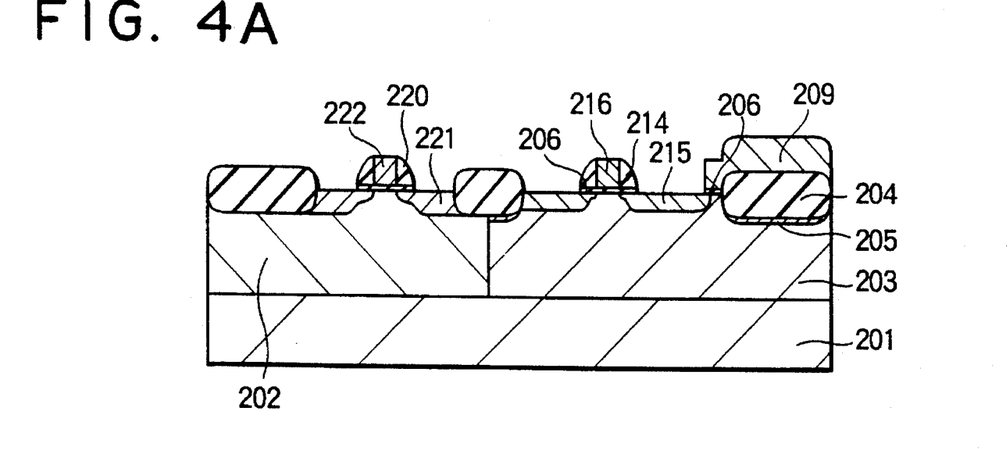
FIGS. 4A to 4C are fragmentary sections showing a series of steps in the second embodiment of a semiconductor device fabrication process according to the invention.
Figure 4B:
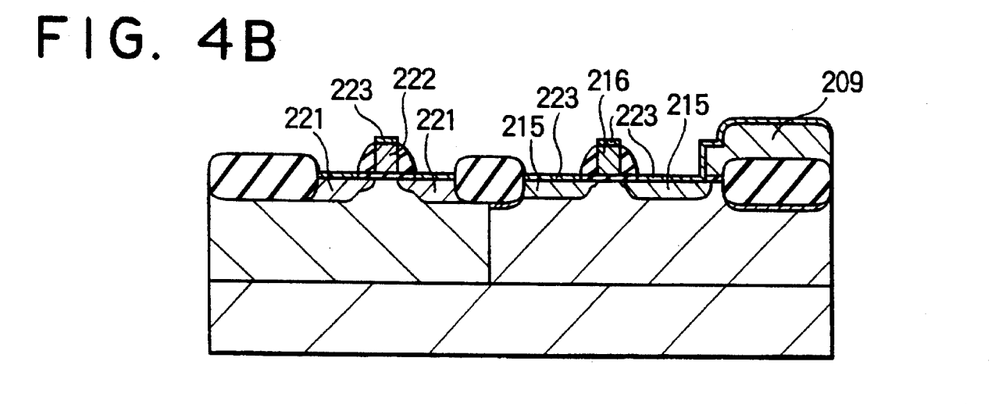

After the step to form the section illustration in FIG. 4A through the processes corresponding to those in the first embodiment, a tungsten layer 223 is selectively grown to an exemplary thickness of 1000 Å on the N$^+$-type diffusion layer 215, P$^+$-type diffusion layer 221, the gate electrodes 216 and 222 and the direct contact electrode 209 by way of selective growth process of tungsten, as shown in FIG. 4B. At this time, the N$^+$-type diffusion layer 215 and the direct contact electrode 209 are electrically shorted by the tungsten layer 223.

Figure 4C:
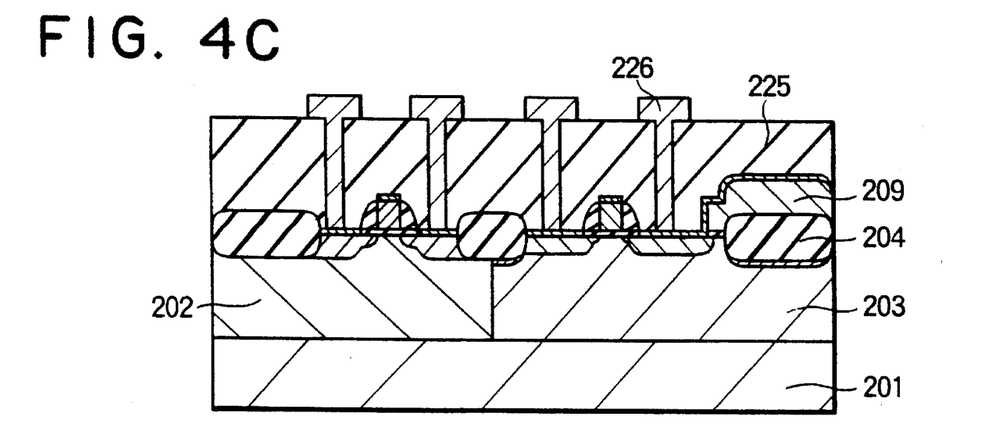

Next, as shown in FIG. 4C, the interlayer insulation layer 225 is deposited by a known technology, the contact holes are formed at predetermined positions, and aluminum is deposited and patterned to form the wiring 226. Thus, the PN dual-gate CMOS can be fabricated.

As set forth above, since the present invention does not remove the gate oxide layer 206 immediately below the direct contact electrode 209, even when overetching is performed so as not to leave residual after etching over the entire surface of the wafer upon formation of the direct contact electrode, the oxide layer 206 which has significantly different etching ratio from the electrode material is present below the direct contact electrode 209 to successfully prevent the substrate from being etched. Therefore, the leak current of the semiconductor device can be reduced to one tenth of the conventional semiconductor device, as shown in FIG. 5. Therefore, it becomes possible to improve reliability of the semiconductor device.

Furthermore, since the semiconductor device fabrication process according to the invention can neglect the photolithographic process for forming the direct contact hole, the fabrication process can be simplified to contribute lowering of the production cost. In addition, when the present invention is applied to fabrication of CMOS semiconductor devices, since P$^-$-type diffusion layer and the P$^+$-type diffusion layer of the P-type transistor can be formed employing the common resist mask, the photolithographic process steps which are otherwise required can be further eliminated to further contribute lowering of the production cost.

Although the invention has been illustrated and described with respect to an exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments within a scope encompassed and equivalents thereof with respect to the features set out in the appended claims.

For instance, while the direct contact electrode is provided in the N-type transistor in the shown embodiments, it is equally possible to provide the direct contact electrode in the P-type transistor. Also, the present invention is applicable to not only CMOS semiconductor devices but also to N-type or P-type MOS semiconductor devices.

What is claimed is:

1. A process for fabricating a semiconductor device comprising the steps of:

forming a gate insulation layer on a first conductive type semiconductor substrate;

forming a polycrystalline silicon layer on said gate insulation layer;

selectively removing said polycrystalline silicon layer to form a gate electrode and a direct contact electrode;

forming a photoresist mask masking said direct contact electrode at least at the side opposing to said gate electrode;

performing ion implantation of a second conductive type impurity for forming an impurity diffused layer at both sides of said gate electrode; and forming a conductive layer covering the surface of one of said impurity diffused layer and the side surface of said direct contact electrode for shorting between said one of impurity diffused layer and said direct contact electrode.

2. A process for forming a semiconductor device comprising the steps of:

forming a gate insulation layer on a first conductive type semiconductor substrate;

forming a polycrystalline silicon layer on said gate insulation layer;

selectively removing said polycrystalline silicon layer to form a gate electrode and a direct contact electrode;

forming a photoresist mask masking said direct contact electrode at least at the side opposing said gate electrode;

performing ion implantation of a second conductive type impurity for forming a low concentration impurity diffused layer at both sides of said gate electrode;

selectively forming an insulation layer by liquid growth process on a region where said photoresist mask is not formed and forming a side wall insulation layer on the side surface of said gate electrode by anisotropic etching of said insulation layer;

performing ion implantation of the second conductive type impurity to form a high concentration impurity diffused layer on a region on the surface of said semiconductor substrate outside of said sidewall insulation layer; and forming a refractory metal silicide layer by depositing a refractory metal layer and heat treating said refractory metal layer to short said high concentration impurity diffused layer and said direct contact electrode.

3. A process for fabricating a semiconductor device comprising the steps of:

forming a gate insulation layer on a first conductive type semiconductor substrate;

forming a polycrystalline silicon layer on said gate insulation layer;

selectively removing said polycrystalline silicon layer to form a gate electrode and a direct contact electrode;

forming a photoresist mask masking said direct contact electrode at least at the side opposing to said gate electrode;

performing ion implantation of a second conductive type impurity for forming a low concentration impurity diffused layer at both sides of said gate electrode;

selectively forming an insulation layer by liquid growth process on a region where said photoresist mask is not formed and forming a side wall insulation layer on the side surface of said gate electrode by anisotropic etching of said insulation layer;

performing ion implantation of the second conductive type impurity to form a high concentration impurity diffused layer on a region of the surface of said semiconductor substrate outside of said side wall insulation layer; and forming a refractory metal silicide layer by selective growth of a refractory metal and heat treatment thereof for shorting said high concentration impurity diffused layer and said direct contact electrode.

4. A process for fabricating a semiconductor device comprising the steps of:

forming a gate insulation layer on a first conductive type semiconductor substrate;

forming a gate electrode and a direct contact electrode on said gate insulation layer;

forming an impurity diffused layer by ion implantation of a second conductive type impurity;

forming a conductive layer to electrically connect said direct contact electrode and said impurity diffused layer;

masking said direct contact electrode at least at a side opposing said gate electrode; and forming a side wall insulation layer on the side surface of said gate electrode, wherein said masking step and said sidewall forming step are performed before the step of forming said impurity diffused layer.

\* \* \* \* \*

UNITED STATES PATENT AND TRADEMARK OFFICE
CERTIFICATE OF CORRECTION

PATENT NO. : 5,521,106
DATED : May 28, 1996
INVENTOR(S) : Kazuhiro Okabe

It is certified that error appears in the above-indentified patent and that said Letters Patent is hereby corrected as shown below:

Column 1, line 13, delete "concerning" and insert --Concerning--;
line 48, delete "N - type" and insert --N⁻ - type--;
line 53, delete "P - type and insert --P⁻ - type--.

Signed and Sealed this

Twenty-seventh Day of August, 1996

Attest:

BRUCE LEHMAN

Attesting Officer        Commissioner of Patents and Trademarks